(12) United States Patent
Raynor et al.

(10) Patent No.: US 8,283,620 B2
(45) Date of Patent: Oct. 9, 2012

(54) OPTICAL SENSOR AND SENSING METHOD WITH STRAY ILLUMINATION COMPENSATION

(75) Inventors: Jeffrey M. Raynor, Edinburgh (GB); David P. Baxter, Edinburgh (GB)

(73) Assignee: STMicroelectronics (Research & Development) Ltd, Marlow, Buckinghamshire (GB)

( * ) Notice: Subject to any disclaimer, the term of this patent is extended or adjusted under 35 U.S.C. 154(b) by 543 days.

(21) Appl. No.: 12/555,535

(22) Filed: Sep. 8, 2009

(65) Prior Publication Data

US 2010/0065720 A1  Mar. 18, 2010

(30) Foreign Application Priority Data

Sep. 11, 2008  (GB) ................. GB0816592.0

(51) Int. Cl.
  *H03F 3/08* (2006.01)
(52) U.S. Cl. ............. 250/214 A; 250/214.1; 250/214 R; 250/214 DC; 257/431; 348/294; 348/302
(58) Field of Classification Search ............... 250/201.1, 250/214.1, 214 R, 214 DC, 214 C, 214 A, 250/214 SW, 208.2, 208.1; 257/431; 348/272, 348/281, 282, 294, 302; 3/201.1, 214.1, 3/214 R, 214 DC, 214 C, 214 A, 214 SW, 3/208.2, 208.1

See application file for complete search history.

(56) References Cited

U.S. PATENT DOCUMENTS

| | | | |
|---|---|---|---|
| 4,309,898 A | 1/1982 | Horton | |
| 4,801,552 A | 1/1989 | Hoff | |
| 4,851,689 A | 7/1989 | Hasegawa | |
| 5,705,807 A | 1/1998 | Throngnumchai et al. | |
| 6,240,309 B1 | 5/2001 | Yamashita et al. | |
| 6,815,211 B1 | 11/2004 | Blazewicz et al. | |
| 7,254,255 B2 | 8/2007 | Dennis | |
| 2004/0080623 A1 | 4/2004 | Cleveland et al. | |
| 2007/0207536 A1* | 9/2007 | Raynor ..................... | 435/287.2 |

FOREIGN PATENT DOCUMENTS

| | | |
|---|---|---|
| EP | 0 933 870 | 8/1999 |
| EP | 0 933 871 | 8/1999 |
| FR | 2 824 724 | 5/2001 |
| WO | WO 99/44359 | 9/1999 |
| WO | WO 00/19705 | 4/2000 |

OTHER PUBLICATIONS

Stanford Research Systems; Digital Lock-In Amplifiers SR810 and SR830—DSP lock-in amplifiers; www.thinkSRS.com; 3 pages.
Stanford Research Systems; Digital Lock-In Amplifiers SR850—DSP lock-in amplifier with graphical display; www.thinkSRS.com; 5 pages.
European Search Report; Application No. EP 09 16 9948; Dec. 8, 2009; 13 pages.
Partial European Search Report; Application No. 09 16 9948; Oct. 14, 2009; 5 pages.
Search Report; Application No. GB0816592.0; Feb. 21, 2009; 1 page.

* cited by examiner

*Primary Examiner* — Francis M Legasse, Jr.
(74) *Attorney, Agent, or Firm* — Gardere Wynne Sewell LLP

(57) ABSTRACT

An optical sensor includes an infra red LED, a photodetector and a lock in charge amplifier. The photodetector passes charge to a feedback capacitor of the charge amplifier following an illumination cycle during which the LED is emitting and also following an illumination cycle during which the LED does not emit. An amplifier presents an output indicative of the difference between the charge generated at the photodetector during the illuminated and non-illuminated cycles.

25 Claims, 11 Drawing Sheets

OPTICAL SENSOR AND SENSING METHOD WITH STRAY ILLUMINATION COMPENSATION

TECHNICAL FIELD

This invention relates to an optical sensor and an optical sensing method. More particularly, but not exclusively, it relates to an optical sensor and sensing method with stray illumination compensation.

BACKGROUND

Typically, biological and biometric infra-red sensors use silicon based PN-junction photo-detectors. The low energy, typically 2 E-19 J (1.24 eV), photons detected by the photo-detector penetrate deep into the photo-detector. This results in the generation of carriers in the photo-detector at a significant distance, for example 10-50 μm from the desired detection region. Consequently, a significant fraction of the carriers generated by the infra-red photons do not contribute to the sensed photo-current. This leads to a low sensitivity limit of the photo-detector.

Furthermore, amplification of the sensed photo-current, as a means of overcoming the low sensitivity limit, is hindered due to the effect of photo-diode leakage current, the so called "dark current" and other effects such as shot noise.

Attempts have been made to overcome the inherent lack of IR sensitivity of PN-junctions by the use of Positive-Intrinsic-Negative (PIN) photodiodes. The structure of a PIN photo-diode produces a deep junction region that is more sensitive to infra-red radiation. However, PIN diodes are not compatible with modern deep sub-micron CMOS technologies. This is because the junction depth of the PIN photodiode must be of the order of 50 μm for optimal efficiency at a wavelength of 950 nm.

In addition to the above, the sensor may not be completely covered by a test subject. This allows stray light, for example ambient visible and infra-red (IR) radiation, to impinge upon the sensor. The ambient visible and infra-red radiation decreases the signal-to-noise ratio associated with the sensor, further reducing the sensor's sensitivity. This problem is exacerbated when the sensor has a low initial sensitivity.

FIG. 1 shows an IR detection system in which a lock-in detection circuit has been used to subtract a background level of photodiode current from a signal current. A controller 102 synchronizes the operation of a first switch 104, used to operate an IR LED 106, and a second switch 107, used to switch between positive and negative unity gain amplifiers 108, 110.

The measured signal current comprises not only the current resulting from the signal caused by photons received from the LED 106 (as desired), but also a background level current. This background level current comprises the sum of the currents which result from the receiver offset voltage, the background signal due to ambient light and the photodiode leakage current.

The circuit of FIG. 1 removes these background signals by switching to the negative unity gain amplifier when the IR LED 107 is switched off, during which time only background signals are measured. The output generated from the low pass filter 112 therefore comprises the difference between the original measured current and the background level, which is the desired current resultant from the signal received from the LED 106.

Unfortunately, this circuit is not compatible with production in a CMOS integrated circuit, and is therefore of limited use, practically. This is because of the resistor 114 that is used in conjunction with operational amplifier 116. The gain of the operational amplifier 116 is proportional to the resistance of the resistor 114 and hence a large gain requires a large resistor 114. Large resistors require large volumes of silicon to produce and are expensive. Furthermore, resistors in general are best avoided, where possible, in integrated circuits such as these. Finally, as the unity gain amplifiers 108,110 have their outputs averaged by the low pass filter 112, a stringent requirement of matching is placed upon the amplifiers 108, 110. This is complex to achieve.

SUMMARY

According to a first aspect there is provided a lock in charge amplifier, for connection to a photodetector, comprising a switch network, a controller, and a charge amplifier, said charge amplifier further comprising a feedback capacitor connected between the charge amplifier's input and output, said circuit, in use, being arranged to receive an input charge from a photodetector, said photodetector having a corresponding illumination source, wherein said controller is arranged to provide a control signal to switch the switch network between at least first and second states and to switch on the illumination source during only one of said first and second states, said first and second states being operable to apply a first input charge, obtained over a first period of time and a second input charge, obtained over a second period of time to said feedback capacitor such that after operation of said first and second states the difference between the first and second charges is stored on the feedback capacitor, the charge amplifier being arranged, in use, to output an output voltage dependent upon the charge stored on the feedback capacitor.

In a first embodiment a further switch capacitor may be provided, and said control signal being further operable to switch the switch network between a third state, operable such that the switch capacitor may be arranged to receive said first input charge and a fourth state operable such that the switch capacitor may be arranged to receive said second input charge, said first and second states applying the charge on said switch capacitor respectively to a first plate of said feedback capacitor and to a second plate of said feedback capacitor. The third and fourth states may be essentially the same.

Note that, in this embodiment, the inversion of the signal, subtracting the charges between the first and second phases is obtained by inverting the switch capacitor. As the same capacitors are used for both the additive and subtractive phases, they are equal in magnitude and no mismatching issues occur.

In this first embodiment, one of said first period of time or second period of time may comprise the sum of the periods of the first and third phases and the other of said first period of time or second period of time may comprise the sum of the periods of the second phase and fourth phases. The switch network may comprise at least five switches, four to allow connection of either plate of the switch capacitor to each of the charge amplifier inputs, and a further switch to allow connection of one of the plates of the switch capacitor to an input source.

Alternatively, in a second embodiment, said first state may be operable to apply said first input charge directly to a first plate of said feedback capacitor and said second state may be operable to apply said second input charge directly to a second plate of said feedback capacitor. There may be provided a further stabilization capacitor connected permanently across the charge amplifier, said stabilization capacitor being orders of magnitude smaller then the feedback capacitor. Said switch network may comprise at least four switches, one each to connect a first plate of said feedback capacitor to said charge amplifier input and output respectively and one each to connect a second plate of said feedback capacitor to said charge amplifier input and output respectively, said network being operable such that, with a first pair of said four switches closed, said feedback capacitor may be switched into the feedback path of the charge amplifier in a first orientation, and with a second pair of said four switches closed, said feedback capacitor may be switched into the feedback path of the charge amplifier in the opposite orientation. Between said first and second states said charge amplifier may operate in at least one transitional state, during which the orientation of the feedback capacitor may be effectively changed.

Said amplifier may comprise a CMOS lock in charge amplifier.

Said first and second periods of time may be substantially equal.

There may be provided a reset phase whereby all the capacitors are effectively short-circuited, there being provided at least one further switch for the purpose.

There may be a reference voltage applied at the non-inverting input of said charge amplifier.

In a further aspect of the invention there is provided an optical sensing apparatus comprising an illumination source, a photodetector and a lock in charge amplifier according to any preceding embodiment, the photodetector being arranged to pass charge to the lock-in charge amplifier during said first and second periods of time, wherein said sensing apparatus may be arranged to turn on the illumination source during only one of said first and second periods of time.

The illumination source may be arranged to emit radiation in the infra red region. The illumination source may comprise an infra red LED Said apparatus may be arranged to perform repeated cycles of at least said first and second states, and further comprise an averaging circuit arranged to produce an averaged output.

In a further aspect there is provided a biomedical sensor comprising an optical sensing apparatus according to any of the above embodiments. The sensor may comprise any one, or combination of the following: blood oximetry sensor, blood pressure sensor.

In an embodiment, a circuit comprises: a differential amplifier having a first input, a second input and an output, the second input connected to a reference voltage terminal; a feedback capacitor connected between the output and the first input; a photosensor having an output terminal; a switched capacitor having a first plate and a second plate; a first switch selectively connecting the first plate to the first input; a second switch selectively connecting the first plate to the second input; a third switch selectively connecting the photosensor output terminal to the first plate; a fourth switch selectively connecting the second plate to the first input; and a fifth switch selectively connecting the second plate to the second input.

In a yet further aspect there is provided a biometric identification apparatus comprising an optical sensing apparatus according to any one of the above embodiments.

Any of the above apparatus may be provided on a single integrated circuit.

BRIEF DESCRIPTION OF THE DRAWINGS

The invention will now be described, by way of example only, with reference to the accompanying drawings, in which.

DETAILED DESCRIPTION OF THE DRAWINGS

Figure 1:
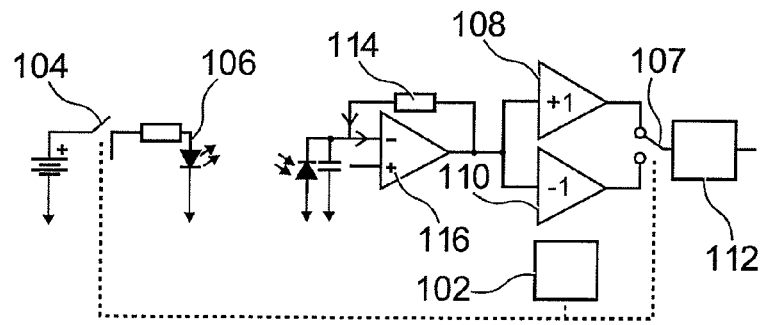
FIG. 1 is a schematic diagram of an embodiment of lock in optical sensing apparatus of the prior art.
Figure 2:
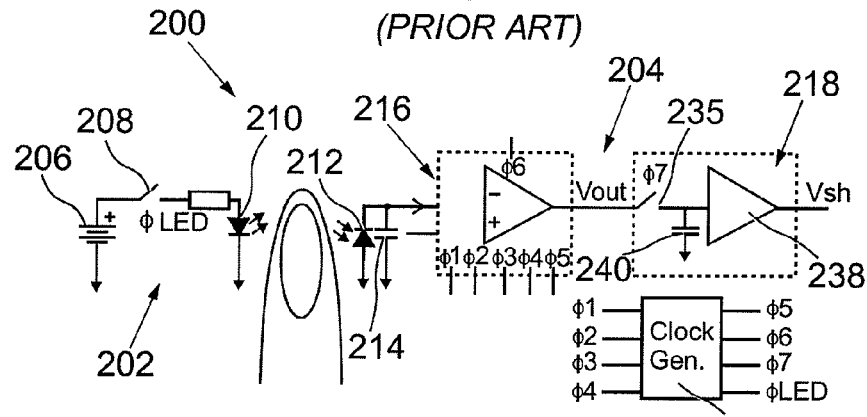
FIG. 2 is a schematic diagram of an embodiment of a lock in optical sensing apparatus comprising an embodiment of a lock in charge amplifier.

Referring now to FIG. 2, a lock in optical sensing apparatus 200 is described which comprises an illumination unit 202 and a sensor unit 204.

The illumination unit 202 comprises a power source 206, a switch 208 and an illumination source 210. Typically, the illumination source 210 is an LED, and usually an infra-red (IR) LED. The illumination source will be referred to hereinafter as the LED 210, although it will be appreciated that any suitable illumination source can be used.

The sensor unit 204 comprises a sensor 212, having an associated capacitance 214 and current source 242 (see, FIG. 3), a lock in charge amplifier 216, a sample and hold circuit 218 and a controller 220. Usually, the sensor 212 is a photodiode or photodiode array. The sensor 212 will be referred to hereinafter as the photodiode 212, although it will be appreciated that any suitable photosensitive sensor can be used. Sample and hold circuit 218 comprises an amplifier 238 and a capacitor 240, and is as known to those skilled in the art.

Figure 3:
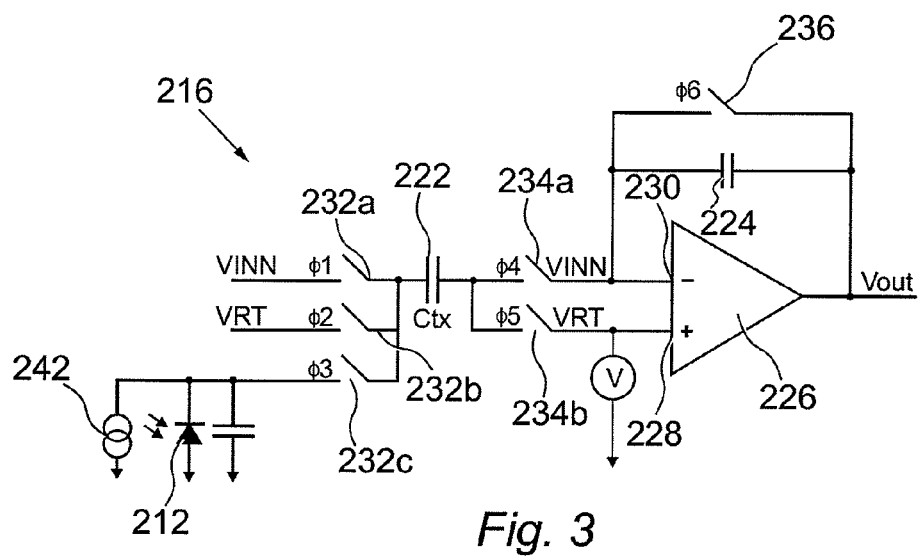
FIG. 3 is a schematic circuit diagram of an embodiment of the lock in charge amplifier of FIG. 2.

FIG. 3 shows the lock in charge amplifier 216 of this embodiment in more detail. It comprises a switched capacitor 222, associated switches 232a, 232b, 232c, 234a, 234b, an operational amplifier 226; a feedback capacitor 224; and a by-pass switch 236. The amplifier 226 has a non-inverting input 228 and an inverting input 230.

Both terminals 222a, 222b of the switched capacitor 222 are separately connectable to the two inputs of operational amplifier 226, depending on the status of switches 232a, 232b, 234a, 234b. One of the said terminals 222a of the switched capacitor 222 is further connectable to the photodiode 212 via switch 232c. A reference voltage VRT is applied to the non-inverting input 228 of operational amplifier 226. The output of the amplifier 226 is linked to the sample and hold circuit 218 via a switch 235. A further switch 236 is provided which is operable to bypass the feedback capacitor 224.

Although shown as simple switches it will be appreciated that in a preferred embodiment the switches 208, 232a-c, 234a,b, 235, 236 are CMOS switches. Furthermore, charge injection cancelling techniques, known to one skilled in the art, may be are employed. Such charge injection cancelling techniques include the use of dummy transistors, anti-phase clocks or any other suitable technique.

Figure 4:
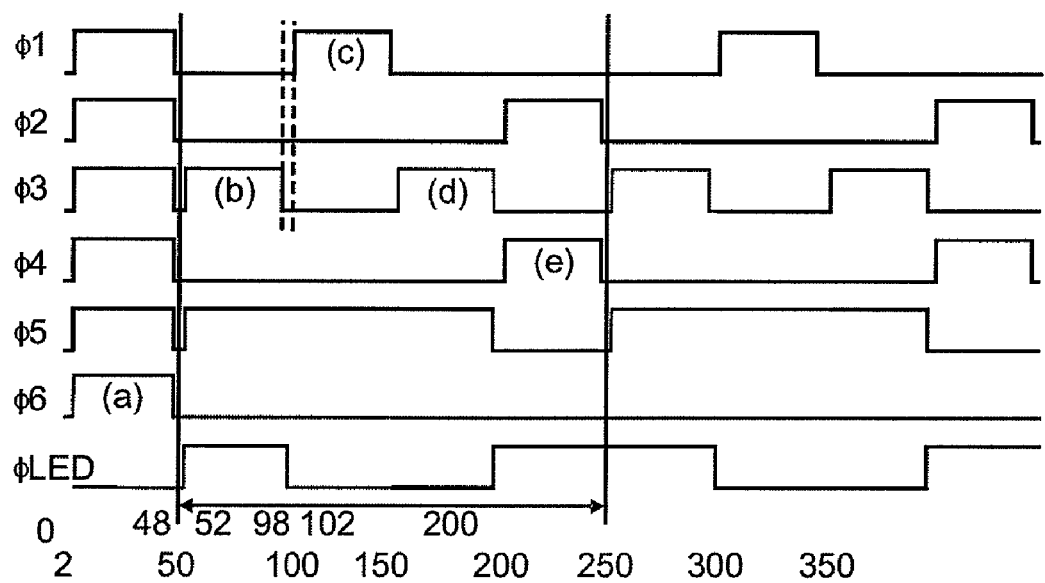
FIG. 4 is a timing diagram showing signal sequences output from a controller of the lock in optical sensing apparatus of FIG. 2.

The controller 220 can generate eight distinct clock signals $\phi_1$, $\phi_2$, $\phi_3$, $\phi_4$, $\phi_5$, $\phi_6$, $\phi_7$ and $\phi_{LED}$. These signals are used to operate the switches 208, 232a-c, 234a,b, 235, 236 in a predetermined sequence of phases which is described in detail below. Referring in particular to FIG. 4, this shows a timing diagram for the clock signals $\phi_1$, $\phi_2$, $\phi_3$, $\phi_4$, $\phi_5$, $\phi_6$ and $\phi_{LED}$, for an operative embodiment. It shows five operational phases (a-e) of the lock in charge amplifier 216 according to this particular operative embodiment. It will be appreciated that other sequences of phases, or sequences that include other phases, are possible.

Phase (a) is a reset phase. The capacitors 214, 222, 224 are discharged and nodes are reset to $V_{RT}$. In the present embodiment the reset phase is achieved by closing all the switches. In an alternative embodiment extra switches correlate $V_{RT}$ with clock signal $\phi_6$ to effect the reset operation.

After phase (a) is completed, and the system is reset, the system continues (in a preferred embodiment) to operate by repeating cycles of four further phases, phases (b)-(e). Details of the phases are as follows.

Figure 5A:
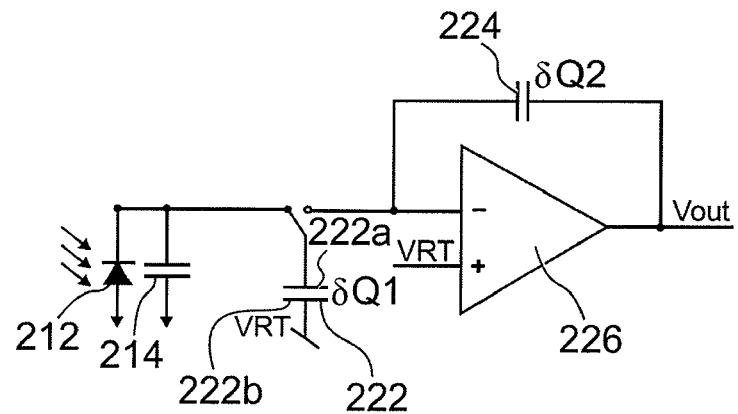
FIGS. 5a to 5d are schematic circuit diagrams of a sensor and lock in charge amplifier arrangement of the lock in optical sensing apparatus of FIG. 2 at sequential stages of operation.

Phase (b): During this phase, clock signals $\phi_3$, $\phi_5$ and $\phi_{LED}$ are high. This results in LED 210 being active, the switched capacitor's 222 first plate 222a being connected to the photodiode and its second plate 222b being connected to the reference voltage VRT at non-inverting input 230. Consequently, photogenerated charge (LED and ambient) generated at the photodiode 212 is stored on the switched capacitor 222. An equivalent circuit of this phase is shown in FIG. 5a.

Phase (c): During this phase, only clock signals $\phi_1$ and $\phi_5$ are high. As a result, the first plate 222a of switched capacitor 222 is connected to the inverting input 228 of the amplifier 226 while the second plate 222b remains connected to the reference voltage VRT/non-inverting input 230 of amplifier 226. The photo-generated charge stored on switched capacitor 222 is therefore added to any charge already stored on the feedback capacitor 224.

Figure 5B:
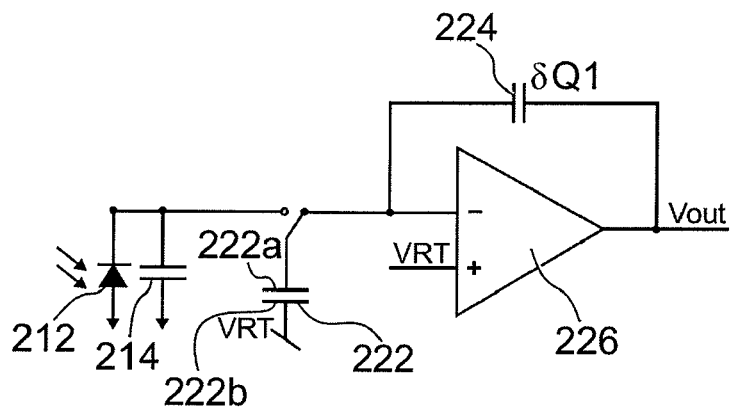

As signal $\phi_{LED}$ is low, the LED 210 is now inactive, while the photodiode 212 is isolated from the switched capacitor 222. Consequently, the photo elements receive only ambient light and the resultant photo-generated charge, along with charge due to the receiver input offset and photodiode leakage, is stored on the photodiode capacitance 214. An equivalent circuit of this phase is shown in FIG. 5b.

Figure 5C:
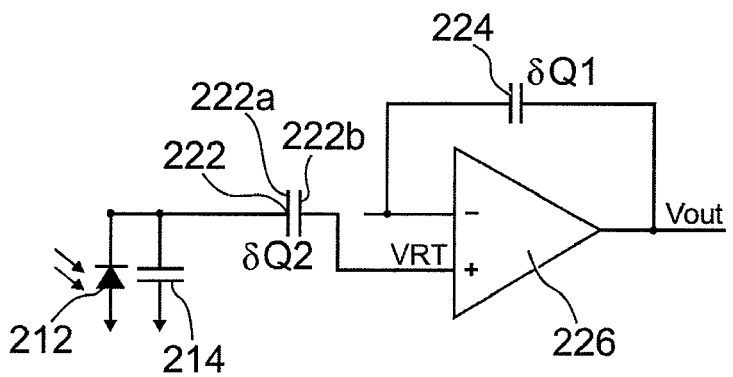

Phase (d): During this phase, clock signals $\phi_3$ and $\phi_5$ are high. Switched capacitor 222 is now connected such that its first plate is connected to the photodiode 212 and its second plate is connected to reference voltage VRT/the non-inverting input 230 of amplifier 226. The charge stored on photodiode capacitance 214 in phase (c), resultant from the background sources, is transferred to, and stored on, the switched capacitor 222. During this phase, $\phi_{LED}$ remains low and therefore LED 210 remains inactive such that the only charge generated during this phase is resultant from background sources. An equivalent circuit of this phase is shown in FIG. 5c.

Phase (e): During this phase, clock signals $\phi_{LED}$, $\phi_2$ and $\phi_4$ are high.

The second plate 222b of switched capacitor 222 is now connected to the inverting input 228 of amplifier 226 and the first plate 222a of switched capacitor 222 is connected to the reference voltage VRT/non-inverting input 230. This has the effect of inverting the switched capacitor 222, compared to phase (c), such that its charge (resultant from the ambient light and other background sources) is subtracted from the charge stored on the feedback capacitor 224.

Figure 5D:
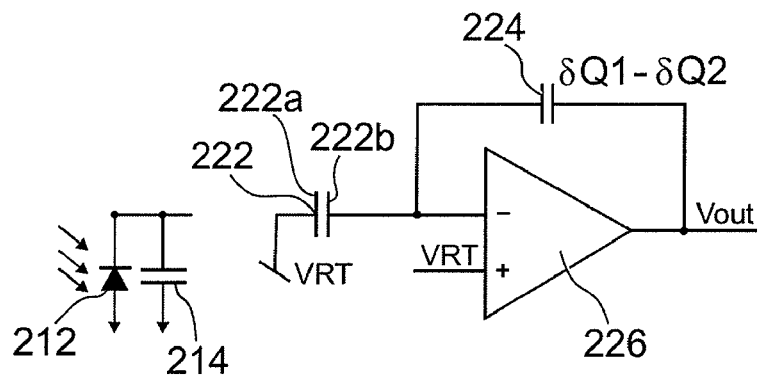

Furthermore as $\phi_{LED}$ is now high, the LED 210 is active. Consequently, the photodiode 212 receives light due to both the LED 210 and ambient light/other background sources, and stores the resultant photogenerated charge on the photodiode capacitance 214, which is now isolated from lock-in amplifier 216. An equivalent circuit of this phase is shown in FIG. 5d.

The system then returns to operate in phase (b) (transferring the charge on photodiode capacitance 214 to switched capacitor 222) and the cycle of phases (b)-(e) are repeated.

It is evident that the change in the charge stored on the feedback capacitor 224 after one cycle (i.e. steps (b)-(e) above) is:

$$(Q_{background}+Q_{LED})-Q_{background}=Q_{LED}.$$

Thus, the charge generated by background sources is eliminated.

Typically, phases (b)-(e) are repeated many times. This allows charge due to the operation of the LED 210 to accumulate on feedback capacitor 224.

It can be seen that in order to prevent loss of photo-generated charge, the clock signals $\phi_1$ to $\phi_5$ must be non-overlapping. Methods to generate non-overlapping clock signals will be known to one skilled in the art.

Further, it can be seen that in the present embodiment clock signals $\phi_2$ and $\phi_4$ are identical. However, it is envisaged that the clock signals $\phi_2$ and $\phi_4$ can be generated independently. This introduces greater flexibility into by allowing for phase shifting of the clock signals if desired. Phase shifting reduces the likelihood of clock breakthrough (that is capacitive coupling between the control input and the switch's input/output signal)

Figure 6:
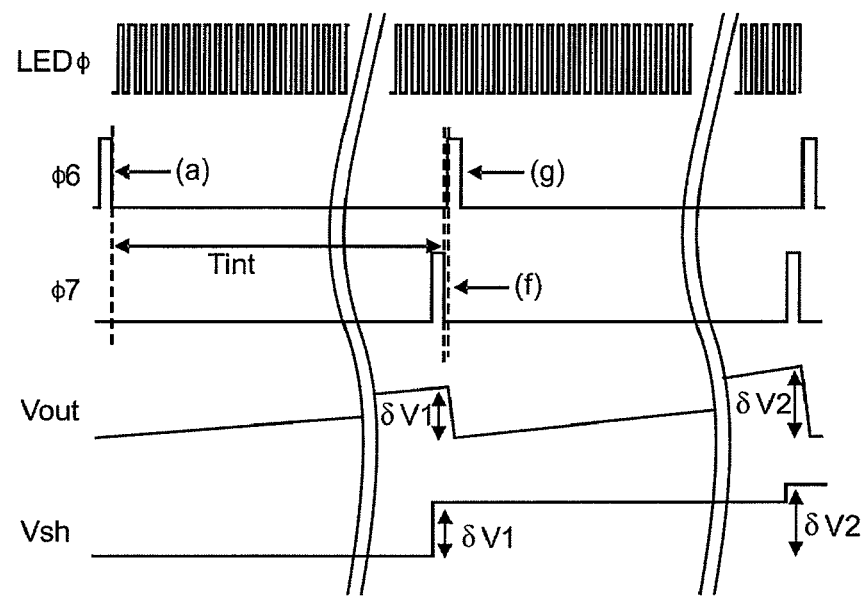
FIG. 6 is a timing diagram showing signal sequences for controlling a sample and hold circuit of the lock in optical sensing apparatus of FIG. 2 and a reset signal for resetting capacitors of the lock in optical sensing apparatus of FIG. 2.

Although FIG. 6 shows the width of all the phases of operation of the lock in charge amplifier 200 to be the same, an important factor of operation is that photogenerated charge due to the ambient light is cancelled effectively. Hence the sum of the widths of phases (c) and (d) should equal the sum of the widths of phases (b) and (e). Also, the widths of phases (c) and (e) should be such so as to ensure that all the charge is transferred from the switched capacitor 222 to the feedback capacitor 226. The time this takes depends on the slew-rate of the operational amplifier 226 used in lock in charge amplifier 216.

Referring now FIG. 6 in particular, the operational phases ((a), (f) and (g)) of the sample and hold circuit 218 are described.

The whole of the apparatus 200 is initialized during phase (a) using the reset clock signal $\phi_6$ (FIG. 4 shows that signals $\phi_1$-$\phi_5$ are also high during this phase). After a time, $T_{int}$, during which time cycles of phases (b)-(e) are been repeated as described above, the output from the lock in charge amplifier 216 ($V_{out}$) is sampled by asserting signal $\phi_7$. This closes switch 235 and allows the transfer of the charge to the sample and hold circuit 218. This is phase (f). After this, the system is reset (phase (a) again) and the procedure repeats. It is important that the high regions of signals $\phi_6$ and $\phi_7$ do not overlap. That is, the rising edge of signal $\phi_6$ should occur after the falling edge of signal $\phi_7$.

In the example shown in FIG. 6, it can be seen that the total voltage measured at the output of the apparatus during the first sample and hold period $\delta V_1$ was less that the total voltage measured during the second sample and hold period $\delta V_2$. This would be the case if the measured IR signal was greater during the second sample and hold period (a)-(f) than the first.

The frequency of signals φ6 and φ7 can be adjusted to suit the application. For example, at low illumination levels the frequency can be reduced. This increases $T_{int}$ and increases the charge stored at the switched capacitor 222, thereby increasing the magnitude of the output signal. However the frequency of these signals should remain significantly above the frequency of interest of the base IR signal being received, typically 2 orders of magnitude greater.

When the apparatus disclosed is being used to accurately measure the blood flow, the output signal from the lock-in pixel should be an order of magnitude higher than that of the heart-rate and to avoid aliasing effects, the clock-switching frequency should be an order of magnitude above the desired output frequency. Exemplary values of parameters for an apparatus for human blood flow measurement comprising an optical sensing apparatus 200 are shown hereinafter.

Assuming that the maximum heart-rate is 200 to 300 bpm, this equates to approximately 3 to 5 Hz and therefore the frequency of clock signals $\phi_6$, $\phi_7$ should be in the range of 300 Hz-1 kHz.

The clock frequency for signals $\phi_1$ to $\phi_5$ is determined by the amount of ambient light to be tolerated and the maximum charge capacity of the capacitors. The slower that signals φ1 to $\phi_5$ are, the more charge that will be collected. If this amount of charge is too great, then there will be not enough capacity on the capacitors to store it and the lock-in circuit will fail.

In bio-sensing applications, the clock frequency for signals $\phi_1$ and $\phi_5$ may be in the region of 10 kHz. This yields a total width of phases (c)+(d) of 1/(2×1 k)=500 µs. If the storage capacitors are 100 fF and a 1V swing is possible, then the maximum photo-current is given by:

$$\begin{aligned}I &= C\frac{dV}{dt}\\ &= 100 \times 10^{-15} F \times 1 \text{ V}/500 \text{ µs}\\ &= 2 \text{ nA}\end{aligned}$$

The photocurrent is dependent on the area of the photodiode 212. A typical size is approximately 100 µm×100 µm for bio-sensing applications, giving an area of $1 \times 10^{-8}$ m$^2$.

At 550 nm, the peak sensitivity of daylight, the maximum responsivity of silicon is 0.44 A/W, and therefore 1 W/m$^2$ of illumination will produce 0.44 A, or for a 100 µm×100 µm pixel, 0.44 nA. This is much less than the maximum photocurrent calculated. If the ambient illumination is greater, the frequency of the clock signals $\phi_1$ to $\phi_5$ can be increased appropriately.

Figure 7:
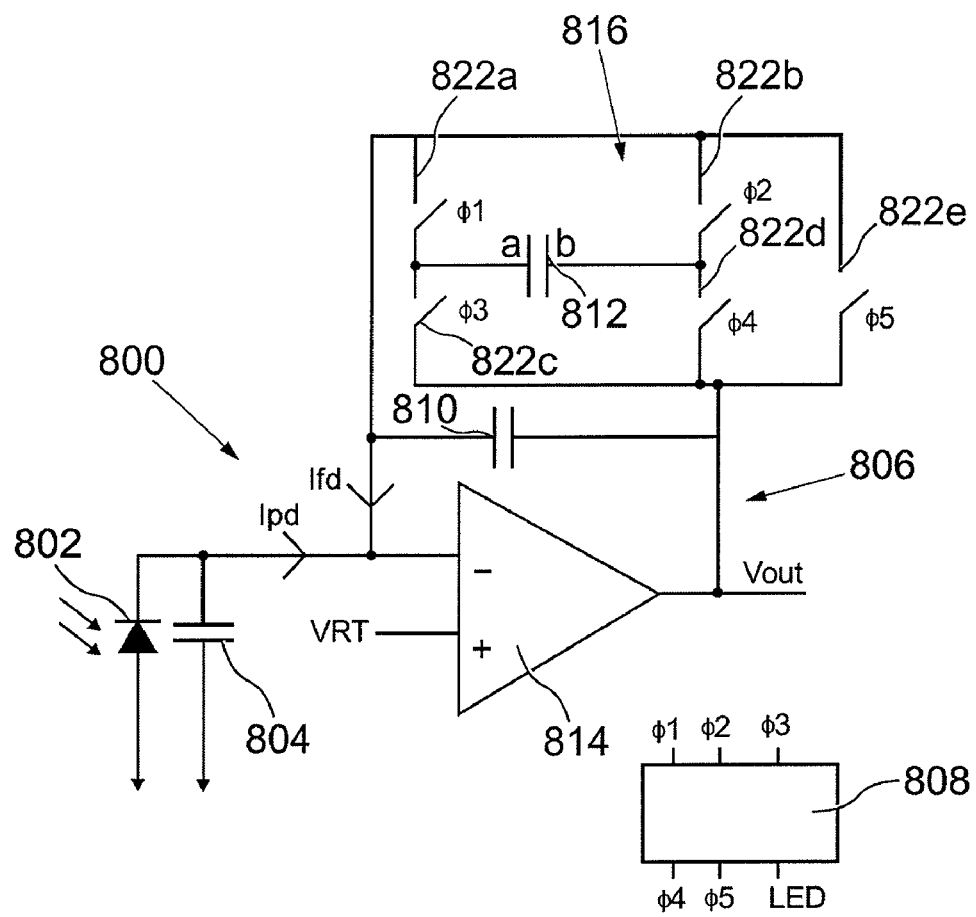
FIG. 7 is a schematic diagram of a second embodiment of a lock in optical sensing apparatus comprising a second embodiment of a lock in charge amplifier.

FIG. 7 shows a lock in optical sensor unit 800 according to an alternative embodiment to that shown if FIG. 3. It comprises a sensor 802, having an associated capacitance 804, a lock in charge amplifier 806 and a controller 808. Usually, the sensor 802 is a photodiode or photodiode array. The sensor 802 will be referred to hereinafter as the photodiode 802, although it will be appreciated that any suitable photosensitive sensor can be used.

Figure 9:
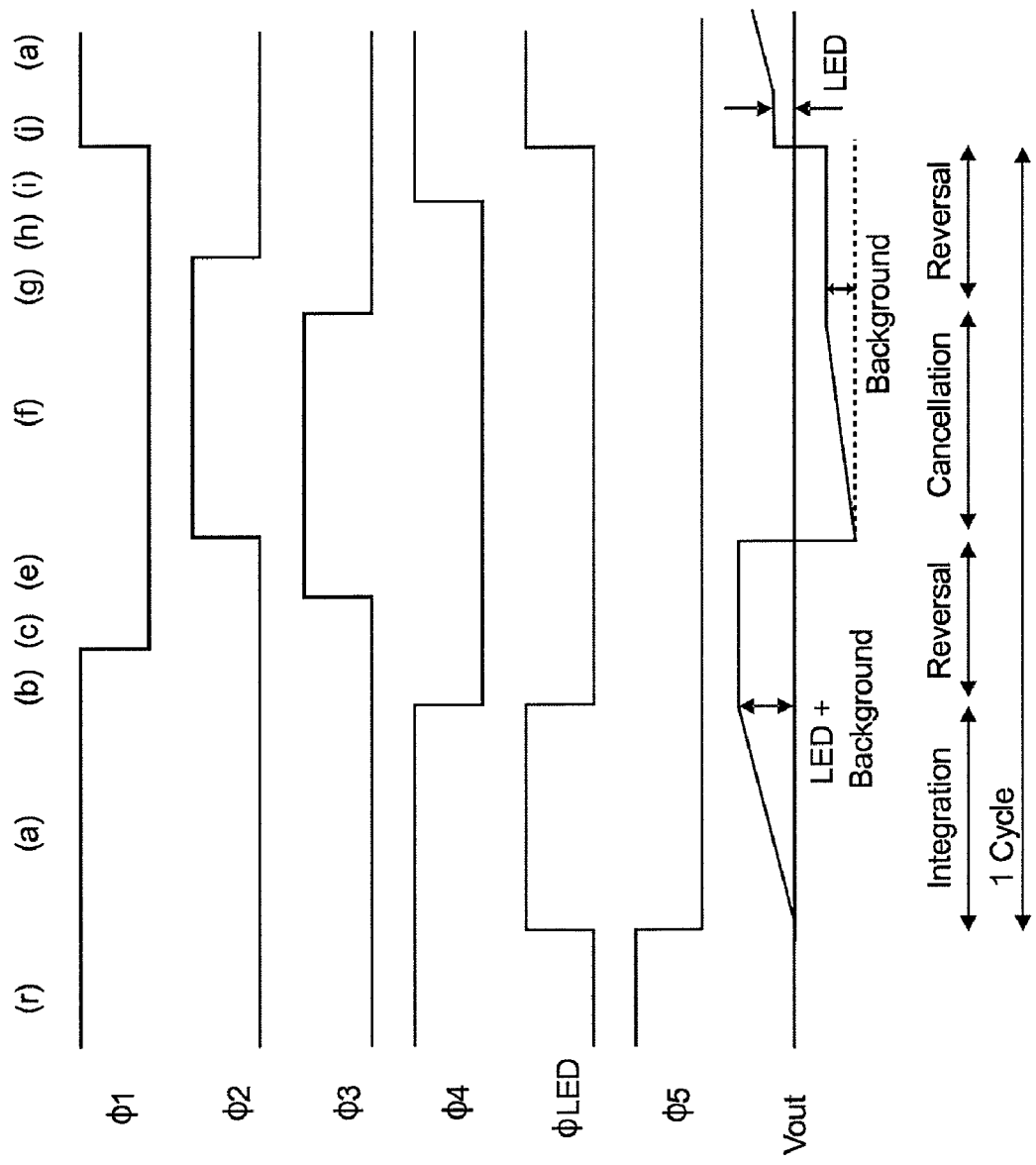
FIG. 9 is a timing diagram showing signal sequences for controlling a sample and hold circuit of the lock in optical sensing apparatus of FIG. 8 with no intra-cycle reset.

The lock in charge amplifier 806 comprises a stabilization capacitor 810, a feedback capacitor 812, an operational amplifier 814 (with a non-inverting input 818 and an inverting input 820) and an array of switches (822a-822e), the latter respectively controlled by timing signals $\phi_1$ to $\phi_5$ from the controller 808. FIG. 9 is a timing diagram for these timing signals.

The stabilization capacitor 810 may be a separate (integrated) component, or alternatively the stray capacitance of the wiring may be used instead. Which of these options is chosen is largely dependent on the stability requirements of the amplifier 814.

Preferably, the ratio of the capacitance of the stabilization capacitor 810 to the feedback capacitor 812 is 1:1000 or less. This is because charge produced during the integration and cancellation phases of operation are split between the two capacitors 810,812 in the ratio of their capacitances. However, the amplifier 814 may require a larger stabilization capacitance for optimum operation, which may necessitate an increase in capacitance of the stabilization capacitor 810.

Figure 10:
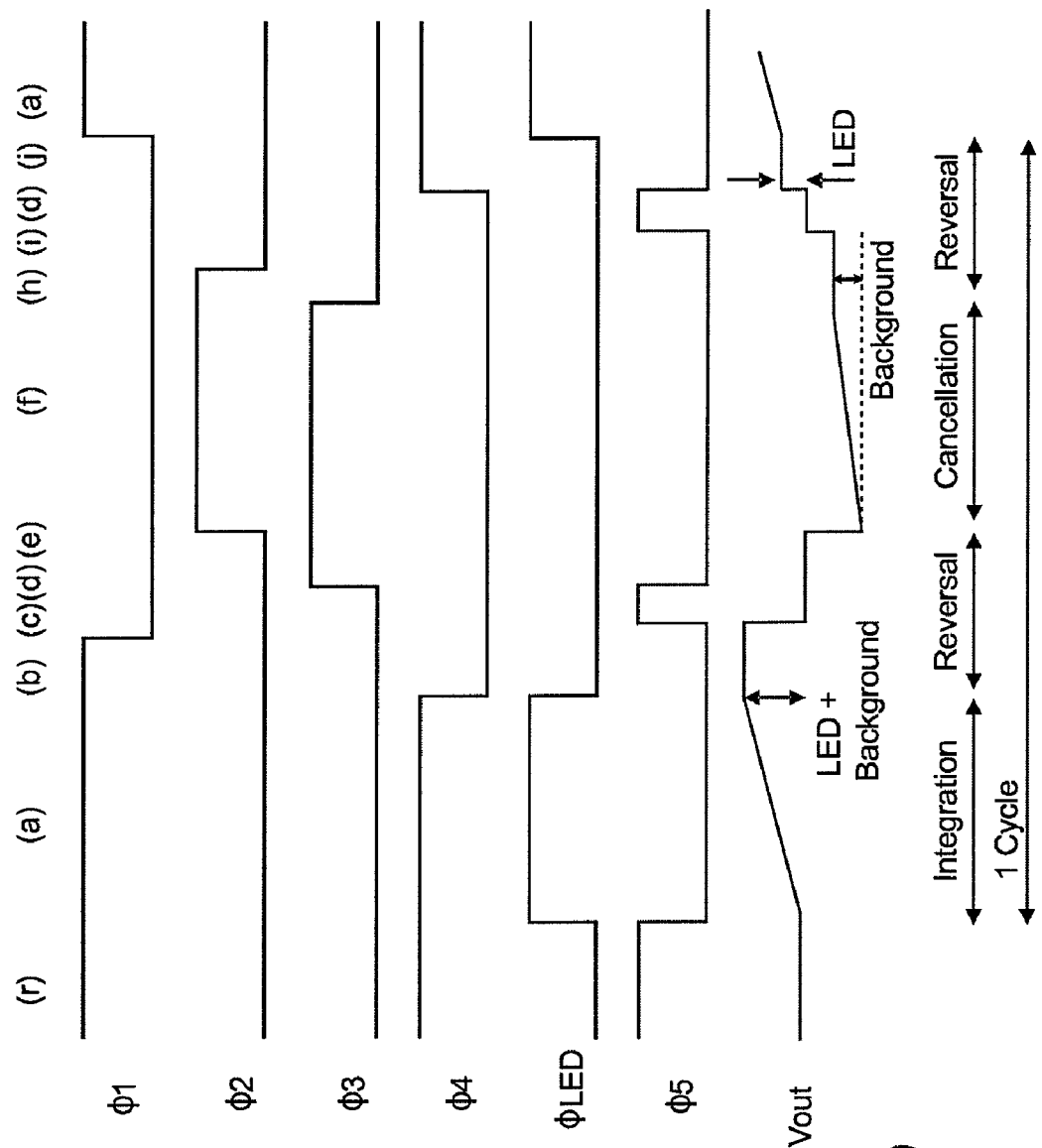
FIG. 10 is a timing diagram showing signal sequences for controlling a sample and hold circuit of the lock in optical sensing apparatus of FIG. 8 with an intra-cycle reset.

During an initial set up phase, the system is reset by the closure of switch 822e (under the influence of clock signal $\phi_5$) along with at least two of the four other switches, one either side of the feedback capacitor 812 (the example of FIG. 10 shows clock signal $\phi_1$ and $\phi_4$ high resulting in the closure of switches 822a and 822d). This has the effect of discharging both the stabilization capacitor 810 and the feedback capacitor 812.

Figure 8A:
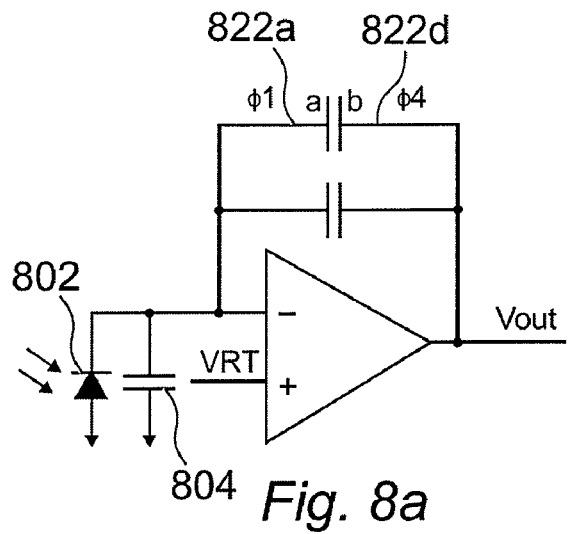
FIGS. 8a to 8j are schematic circuit diagrams of a sensor and lock in charge amplifier arrangement of the lock in optical sensing apparatus of FIG. 8 at sequential stages of operation.
Figure 8B:
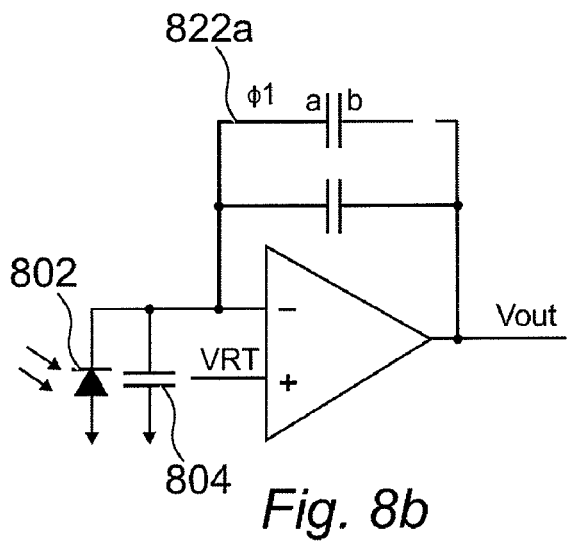
Figure 8C:
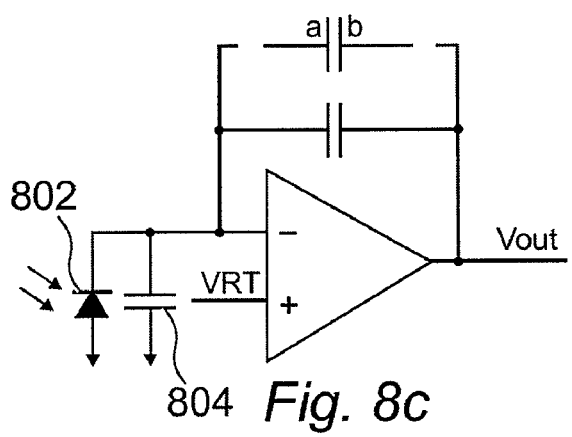
Figure 8D:
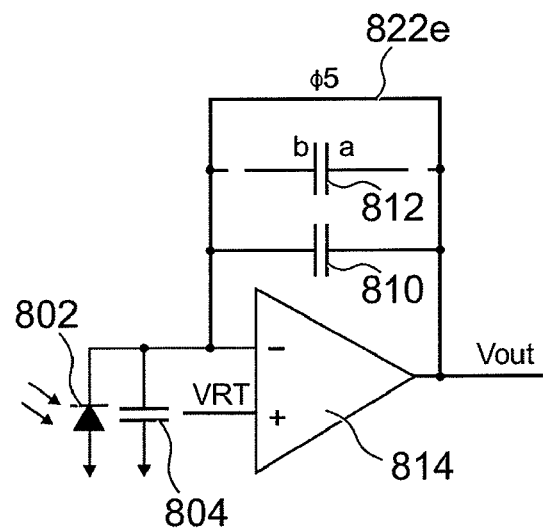
Figure 8E:
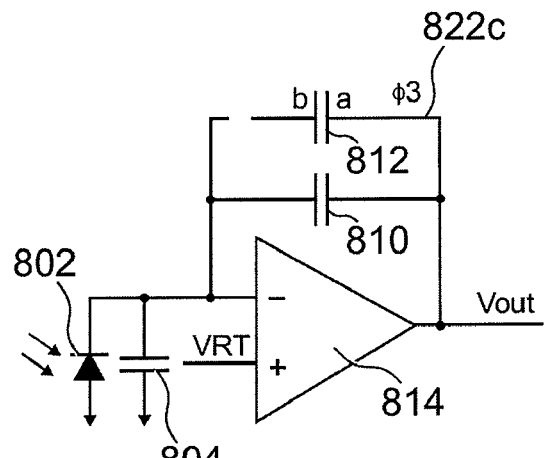
Figure 8F:
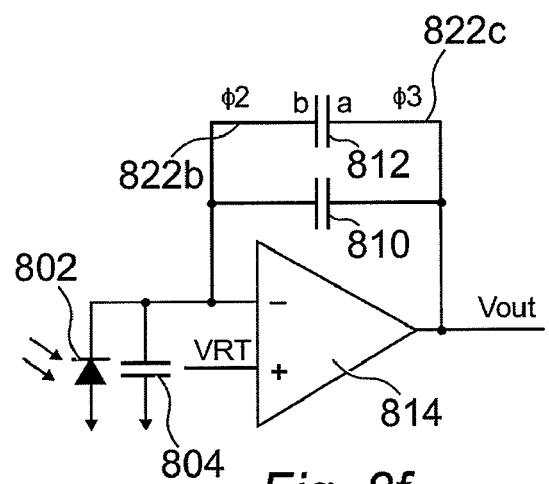
Figure 8G:
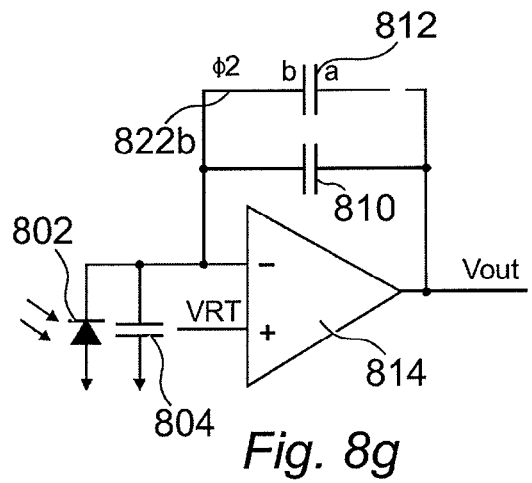
Figure 8H:
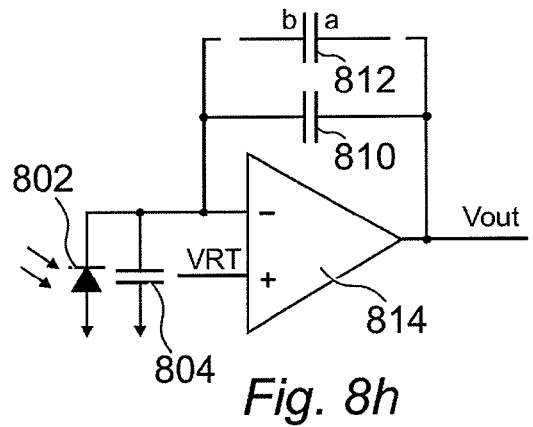
Figure 8I:
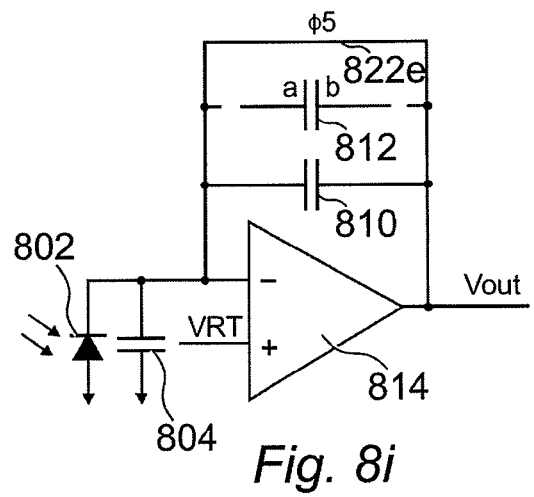
Figure 8J:
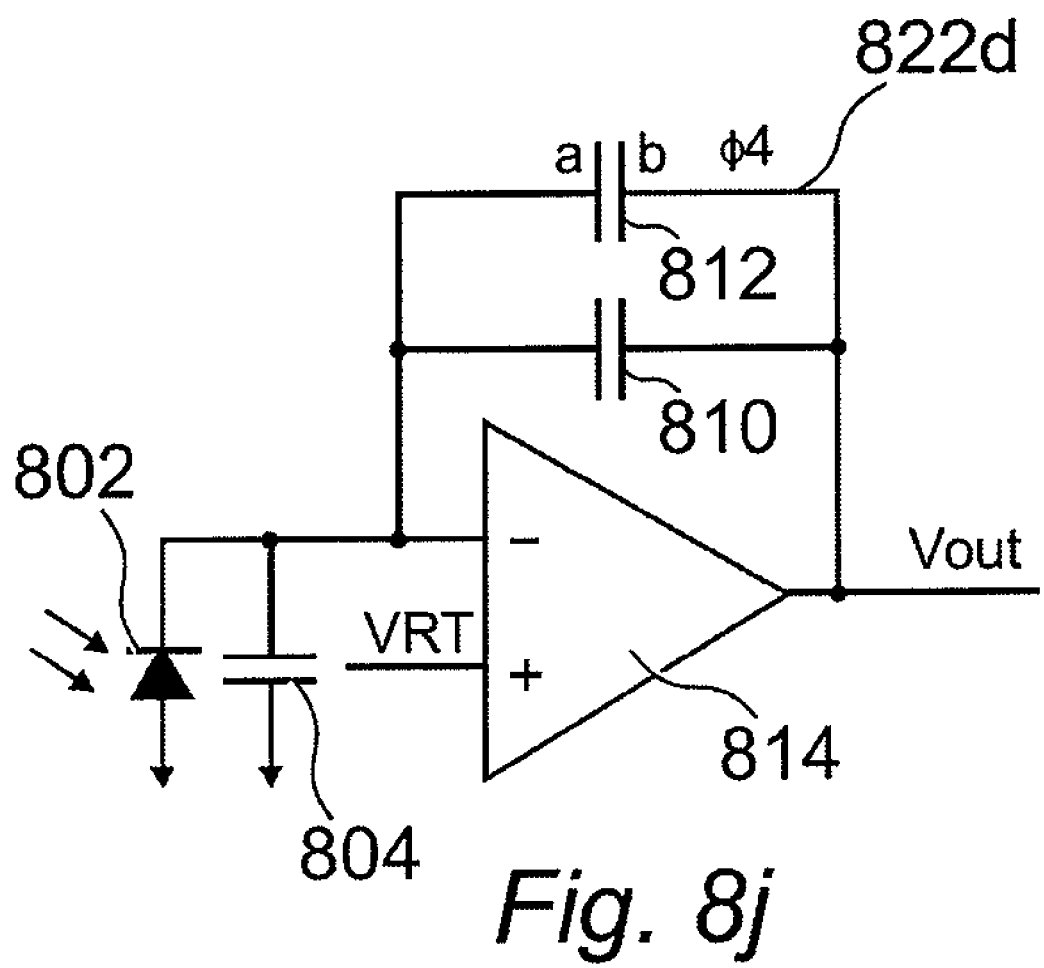

FIG. 8a shows an equivalent circuit for the circuit of FIG. 7 operating in a first phase, phase (a). Clock signals $\phi_1$ and $\phi_4$ are high resulting in switches 822a and 822d being closed and the feedback capacitor 812 being connected across the amplifier 814. At the same time the sensor 802 is subject to illumination ($\phi_{LED}$ also being high) and therefore point charge from the illumination of the sensor 802 is accumulated, primarily on the feedback capacitor 812, with amplifier output $V_{out}$ increasing accordingly. The charge collected results from both photons received from an illumination source, for example an LED, and also background sources.

FIGS. 8b to 8e respectively show equivalent circuits for the circuit of FIG. 7 operating in five transitional phases of this embodiment, phases (b) to (e). Once the integration period phase (a) is completed, the illumination source is switched off (signal $\phi_{LED}$ goes low) and the orientation of the feedback capacitor 812 is reversed. Phases (b) to (f) effect this reversal. Firstly, in phase (b), clock signal $\phi_4$ goes low, after which, in phase (c), signal $\phi_1$ also goes low, thereby opening switches 822d and 822a thereby isolating feedback capacitor 812. This is followed by an optional phase, phase (d), during which clock signal $\phi_5$ goes high, closing switch 822e. This resets the charge on the stabilization capacitor 810, reducing problems associated with charge injection (charge introduced onto the capacitors due to coupling of the clock signals) resultant from certain switching implementations. During phase (e), clock signal $\phi_3$ is raised high, closing switch 822c.

Transition is completed by clock signal $\phi_2$ being raised high to close switch 822b which thereby results in the feedback capacitor being connected in the opposite orientation to that of phase (a). The resultant phase is phase (f). The effect of reversal of the feedback capacitor on the output is that $V_{out}$ will jump negative, but will have the same magnitude (at the beginning of phase (f)) as it had at the end of phase (a).

Phase (f) is the main cancellation phase. As with phase (a), output $V_{out}$ of the amplifier 814 increases due to charge at the input from the photodiode. However, as the illumination source is switched off during Phase (f), only charge resultant from background sources associated with the sensor 802 is transferred onto the feedback capacitor 812 during this time. Consequently the charge stored on the feedback capacitor at the end of phase (f) is resultant from charge due to the LED only. In order to ensure accurate compensation for background light the durations of Phases (a) and (f) should be equal.

Phases (g) to (j) (FIGS. 8g-8j) simply show the transitional states during which the feedback capacitor is again reversed, back to its orientation in state (a), which immediately follows state (j). Clock signals $\phi_3$ and $\phi_2$ are sequentially cycled low so as to open switches 822c and 822b respectively. Phase (i) is again an optional phase to reset stability capacitor 810, by raising clock signal $\phi_5$ thereby closing switch 822e. Phase (j) then opens switch 822e and closes switch 822d. The system is returned to its start setting by the closure of switch 822a (phase (a)). At the beginning of phase (a), therefore, the feedback resistor should only have an amount of charge on it resultant from the LED only, and therefore $V_{out}$ should reflect this, its magnitude being representative of the charge due to the LED only.

The duration of phases (b) to (e) and (g) to (i) should be kept as short as practical to increase the performance of the system.

Typically, multiple integration and cancellation phases are performed to yield an average result.

FIG. 10 shows the timing diagram of FIG. 9, but without the optional intra-cycle reset phases (d) and (i). Ideally, these phases are not performed as they add to the "dead time" (time when the system is not collecting light) and decreases sensitivity.

It should again be clear to the skilled person that the above described operational embodiment may be varies within the scope of the present invention. Phases may differ, may be removed or added, or their order changed. In particular the skilled person will readily recognize that the transitional phases between phase (a) and phase (f) (in both directions) may differ, for example phase (b) may open switch 822a instead of 822d, which itself could then be opened in phase (c).

The circuit described in the second embodiment (FIG. 7) above does have one drawback in that it suffers from sensitivity to input-offset voltage. An ideal op-amp has 0 volts between the input terminals when operating in closed-loop feedback mode. However a practical op-amp has a small difference in voltage, called input offset voltage. With repeated switching of the input, this signal is increased, which accumulates with repeated cycles. Consequently, a limit is placed on the signal that can be detected.

In both the embodiments described above, it is still possible that, as a result of component mismatch during manufacture or non-ideal behavior of the components (e.g. charge injection), the cancellation of the background from the signal is incomplete.

This can be detected by either ensuring the LED is on during all the phases or ensuring the LED is always off and measuring the output from the lock-in apparatus 200, 800. Ideally, there will be no output from the lock-in amplifier. If there is, the phases of the timing signals can be adjusted (lengthened or shortened as appropriate) to achieve a null output.

While various embodiments of the invention have been described, it will be apparent to those skilled in the art once given this disclosure that various modifications, changes, improvements and variations may be made without departing from the scope of the invention.

What is claimed is:

1. A lock in charge amplifier circuit configured to be coupled to an output of a photodetector which generates input charge in response to illumination by an illumination source, the lock in charge amplifier circuit comprising:
a switch network, a controller, and a charge amplifier, said charge amplifier further comprising a feedback capacitor connected between an input of the charge amplifier and an output of the charge amplifier;
wherein said controller is configured to provide a control signal to switch the switch network between at least first and second states and to switch on the illumination source during only one of said first and second states;
said first and second states being operable to apply a first input charge obtained over a first period of time and a second input charge obtained over a second period of time to said feedback capacitor such that after operation of said first and second states a difference between the first and second input charges is stored on the feedback capacitor, the charge amplifier configured to output an output voltage dependent upon the charge stored on the feedback capacitor; and
wherein said first state is operable to apply said first input charge directly to a first plate of said feedback capacitor and said second state is operable to apply said second input charge directly to a second plate of said feedback capacitor.

2. The circuit as claimed in claim 1 further comprising a stabilization capacitor connected across the charge amplifier.

3. The circuit as claimed in claim 1 wherein said switch network comprises at least four switches, one switch each to connect a first plate of said feedback capacitor to said charge amplifier input and output respectively and one switch each to connect a second plate of said feedback capacitor to said charge amplifier input and output respectively, said switch network being operable such that, with a first pair of said four switches closed, said feedback capacitor is switched into a feedback path of the charge amplifier in a first orientation, and with a second pair of said four switches closed, said feedback capacitor is switched into the feedback path of the charge amplifier in an opposite orientation.

4. The circuit as claimed in claim 1 wherein, between said first and second states, said charge amplifier operates in at least one transitional state, during which the orientation of the feedback capacitor is effectively changed.

5. The circuit of claim 1 wherein the lock in charge amplifier comprises CMOS circuitry.

6. The circuit of claim 1 wherein said first and second periods of time are substantially equal.

7. The circuit of claim 1 further comprising a switch circuit for providing a reset phase whereby all the capacitors are effectively short-circuited.

8. The circuit of claim 1 further comprising circuitry configured to apply a reference voltage at a non-inverting input of said charge amplifier.

9. The circuit as claimed in claim 1 further comprising an additional switch capacitor, and said control signal being further operable to switch the switch network between a third state operable such that said additional switch capacitor is configured to receive said first input charge and a fourth state operable such that said additional switch capacitor is arranged to receive said second input charge.

10. The circuit as claimed in claim 9 wherein the switch network comprises at least five switches, a first through fourth switches configurable to allow connection of either plate of the switch capacitor to each input of the charge amplifier, and a fifth switch configurable to allow connection of one of the plates of the switch capacitor to an input source.

11. The circuit as claimed in claim 9 configured such that said first and second states each apply the charge comprised on said additional switch capacitor onto said feedback capacitor with a reversed polarity to that said first state.

12. The circuit as claimed in claim 11 wherein one of said first period of time or second period of time comprises a sum of periods of first and third phases and the other of said first period of time or second period of time comprises a sum of periods of second phase and fourth phases.

13. The circuit as claimed in claim 12 wherein the third and fourth phases are essentially the same.

14. The circuit as claimed in claim 2 wherein said stabilization capacitor is orders of magnitude smaller than the feedback capacitor.

15. Apparatus, comprising:
an illumination source;
a photodetector;
a lock in charge amplifier including a feedback capacitor, the amplifier coupled to an output of the photodetector;
a control circuit configured arranged to turn on the illumination source within a first part of a cycle but not a second part of a cycle; and
a switching circuit configured to selectively pass charge from the illuminated photodetector to the lock-in charge amplifier during a first time period within the first part of the cycle and selectively pass charge from the non-illuminated photodetector to the lock-in charge amplifier during a second time period within the second part of the cycle so that after completion of the second time period a difference between the first time period charge and second time period charge is stored on the feedback capacitor, the charge amplifier configured to output an output voltage dependent upon the difference charge stored on the feedback capacitor;
wherein the switching circuit is further configured to repeat the cycle including the first and second parts, and
further comprising an averaging circuit configured to produce an averaged output.

16. The apparatus according to claim 15 wherein the illumination source is arranged to emit radiation in the infra red region.

17. The apparatus according to claim 15 wherein the illumination source comprises an infra red LED.

18. The apparatus according to claim 15 wherein the control circuit outputs a control signal to the switching circuit and the illumination source.

19. The apparatus of claim 15 wherein the photodetector detects a biomedical parameter.

20. The apparatus of claim 19 wherein the biomedical parameter is any one or combination of the following: blood oximetry, and blood pressure.

21. Apparatus, comprising:
an illumination source;
a photodetector;
a lock in charge amplifier including a feedback capacitor, the amplifier coupled to an output of the photodetector;
a control circuit configured to turn on the illumination source within a first part of a cycle but not a second part of a cycle; and
a switching circuit configured to selectively pass charge from the illuminated photodetector to the lock-in charge amplifier during a first time period within the first part of the cycle and selectively pass charge from the non-illuminated photodetector to the lock-in charge amplifier during a second time period within the second part of the cycle so that after completion of the second time period a difference between the first time period charge and second time period charge is stored on the feedback capacitor, the charge amplifier configured to output an output voltage dependent upon the difference charge stored on the feedback capacitor;
wherein said switching circuit is coupled at the input of the lock-in charge amplifier and further comprises an additional switch capacitor configured such that said charge is passed from said illuminated and non-illuminated photodetector to the lock in charge amplifier via said additional switch capacitor.

22. A circuit, comprising:
a differential amplifier having a first input, a second input and an output, the second input connected to a reference voltage terminal;
a feedback capacitor connected between the output and the first input;
a photosensor having an output terminal;
a switched capacitor having a first plate and a second plate;
a first switch selectively connecting the first plate to the first input;
a second switch selectively connecting the first plate to the second input;
a third switch selectively connecting the photosensor output terminal to the first plate;
a fourth switch selectively connecting the second plate to the first input;
a fifth switch selectively connecting the second plate to the second input; and
a control circuit which is configured to control selective actuation of the first through fifth switches, the control circuit having first through fifth control signal outputs for application to control the first through fifth switches in accordance with a multi-phase cycle including:
a first phase which selectively activates the third and fifth switches;
a second phase which selectively activates the first and fifth switches;
a third phase which selectively activates the third and fifth switches; and
a fourth phase which selectively activates the second and fourth switches.

23. The circuit of claim 22 further including a selectively switched illumination source configured to illuminate the photosensor, wherein the control circuit further comprises an illumination control signal output, that illumination control signal output causing activation of the illumination source during the first phase but not during the second and third phases.

24. A circuit, comprising:
a charge amplifier including a feedback capacitor connected between an input of the charge amplifier and an output of the charge amplifier;
a switch network coupled to the feedback capacitor of the charge amplifier;
a controller is configured to control operation of the switch network between at least a first state and a second state;
said first state configured to apply a first input charge obtained over a first period of time directly to a first plate of said feedback capacitor;
said second state configured to apply a second input charge obtained over a second period of time directly to a second plate of said feedback capacitor;
wherein a charge difference between the first input charge and second input charge is stored on the feedback capacitor;
said charge amplifier configured to generate an output voltage dependent upon the charge difference stored on the feedback capacitor;
wherein a photodetector is configured to supply the first input charge and second input charge.

25. The circuit of claim 24, wherein said photodetector is illuminated during only one said first and second states.

* * * * *

UNITED STATES PATENT AND TRADEMARK OFFICE
CERTIFICATE OF CORRECTION

| | |
|---|---|
| PATENT NO. | : 8,283,620 B2 |
| APPLICATION NO. | : 12/555535 |
| DATED | : October 9, 2012 |
| INVENTOR(S) | : Jeffrey M. Raynor et al. |

It is certified that error appears in the above-identified patent and that said Letters Patent is hereby corrected as shown below:

In the Claims:

At column 11, claim number 15, line number 11, please delete the word "arranged".

Signed and Sealed this
First Day of January, 2013

David J. Kappos
*Director of the United States Patent and Trademark Office*